(12) United States Patent
Stanley

(10) Patent No.: US 6,201,395 B1
(45) Date of Patent: Mar. 13, 2001

(54) DUAL MODE GRADIENT COIL SYSTEM

(75) Inventor: Gerald R. Stanley, Osceola, IN (US)

(73) Assignee: Crown Audio, Inc., Elkhart, IN (US)

( * ) Notice: Subject to any disclaimer, the term of this patent is extended or adjusted under 35 U.S.C. 154(b) by 0 days.

(21) Appl. No.: 09/107,163

(22) Filed: Jun. 29, 1998

Related U.S. Application Data

(60) Provisional application No. 60/064,030, filed on Nov. 4, 1997.

(51) Int. Cl.[7] .................................................. G01R 33/20
(52) U.S. Cl. ............................................................ 324/322
(58) Field of Search ..................................... 324/300–322

(56) References Cited

U.S. PATENT DOCUMENTS

| | | | |
|---|---|---|---|
| 4,788,452 | * | 11/1988 | Stanley ..................................... 307/71 |
| 4,959,613 | | 9/1990 | Yamamoto et al. .................. 324/318 |
| 5,182,465 | * | 1/1993 | Stanley ................................. 307/115 |
| 5,334,937 | | 8/1994 | Peck et al. ............................ 324/318 |
| 5,406,205 | | 4/1995 | Muller ................................... 324/318 |
| 5,513,094 | * | 4/1996 | Stanley .................................... 363/98 |
| 5,572,133 | * | 11/1996 | Bunk ..................................... 324/322 |

FOREIGN PATENT DOCUMENTS

WO 95/15612 * 6/1995 (WO).

* cited by examiner

*Primary Examiner*—Christine K. Oda
*Assistant Examiner*—Tiffany A. Fetzner
(74) *Attorney, Agent, or Firm*—Baker & Daniels

(57) ABSTRACT

A dual mode gradient coil system in which amplifiers powered by a single signal source are connected by a switch to a plurality of coils. The switch selectively serves to place the coils in series with said amplifiers placed in parallel for a high change in magnetic field per unit distance or, alternatively, to allow each coil to be driven by a separate amplifier for a high change in magnetic field per unit time.

17 Claims, 4 Drawing Sheets

Dual Configuration Single Gradient Coil System

Split Gradient Coil System

DUAL MODE GRADIENT COIL SYSTEM

This application claims benefit of Provisional application Ser. No. 60/064030 filed Nov. 4, 1997.

BACKGROUND OF THE INVENTION

The power output requirements for the next generation of magnetic resonance imaging scanners is a substantial performance step up from the current available scanners. A doubling of the gradient strength is desired with a simultaneous increase in duty cycle. In some cases the desired increase in duty cycle is as large as a five to one ratio with the new objective being 75 percent. No increases in the slew rate or change in magnetic field per unit of time (dB/dt) will be permitted because of the human limitations resulting from muscle twitch and eventually associated pain that results from internally produced voltages on the nervous system. Additionally, there is the ever increasing pressure to contain health care costs which limits the amount of money available to improve on technology.

Presently there is an inherent limitation in the available operating voltages of high-voltage semi-conductors which in turn limits the available output voltage of the gradient amplifiers which drive the coils of the imaging scanners. If the coils are redesigned for lower voltage requirements, the resulting field will not have the desired resolution as there will be too few current carrying conductors or turns in the coil. Heretofore several approaches have been used to increase the available coil voltage. One such approach was to switch a high voltage supply in series with the existing gradient amplifier to counter high voltage requirements during a ramp of current into the coil. After the ramp has passed, the power supply is removed from the circuit leaving only the gradient amplifier in control of the coil. In the accompanying figures (FIG. 1 and FIG. 2) two prior art additional approaches are illustrated. One (FIG. 2) utilizes a split gradient coil system in which two gradient amplifiers 20, 22 per axis of the scanner are associated with the gradient coil 18 which is split into two halves per axis. Each half would require only half the total voltage required by high speed imaging. This reduces the required voltage of the gradient amplifiers to one half of the requirement that occurs when the gradient coils are placed in series. In this approach, the system lacks the ability to place the coils in series and thus there is no way to shift between a high dB/dt and a high dB/dx which is representative of the change in magnetic field per unit distance.

Another approach which has been used incorporates a dual configuration single gradient coil system. This system as illustrated in the accompanying prior art drawing (FIG. 1) uses a single gradient coil 10 per axis of the imaging scanner and two gradient amplifiers 12, 14 for each such axis. The two amplifiers can be used either for increased (double) voltage by placing them in series (a high dB/dt) or by placing them in parallel for increased (double) current for a high dB/dx using switch 16. In this dual configuration system, when two gradient amplifiers are used for single gradient coil and the amplifiers share a single power supply, the amplifiers will be restricted to a half-bridge topology which can only produce one half of the total supply voltage per amplifier. The semi-conductors or amplifiers of this half bridge are then exposed to the full supply voltage. This problem of exposing the semi-conductors to a full voltage supply can be solved by utilizing the full bridge with a separate floating power supply for each amplifier. This results in a costly solution since there must be individual power supplies for each gradient system.

SUMMARY OF THE INVENTION

In the following described invention the disadvantages of the afore-described prior art are overcome by utilizing an amplifier configuration in conjunction with a split coil design. Through a switch, the split coil components of the gradient coil are connected as a single seriesed coil when the amplifiers are placed in parallel for doubling the field of strength at medium speed or, alternatively, the individual amplifiers are each connected to a single split coil component for high speed imaging at standard field strengths. While in the accompanying invention one cannot get both double field strength and full speed at the same time, only one half of the amplifier power would be required for full capability. If desired, it is possible to double the number of amplifiers at a later time for full capability. Through the accompanied invention one can have a system capable of high speed imaging at acceptable dB/dt limits without a substantial increase in cost of the system. Additionally by sharing a power supply for each split coil or axis of the imaging scanner, a substantial reduction in size of the system occurs in comparison to the current systems requiring all axes of the scanner to be individually powered.

Accordingly, it is an object of this invention to provide a gradient coil system usable in magnetic resonance imaging scanners having a split coil design allowing either the doubling of the standard field strength at medium or reduced speed or the use of the standard field strength at high speed imaging.

Another object of this invention is to provide a split gradient coil having an economical dual mode operable configuration.

Other objects of this invention will become apparent upon a reading of the following description.

DESCRIPTION OF THE PREFERRED EMBODIMENTS

The preferred embodiments illustrated are not intended to be exhaustive or to limit the invention to the precise forms disclosed. They are chosen and described in order to best explain the principles of the invention and their application and practical use.

Figure 3:
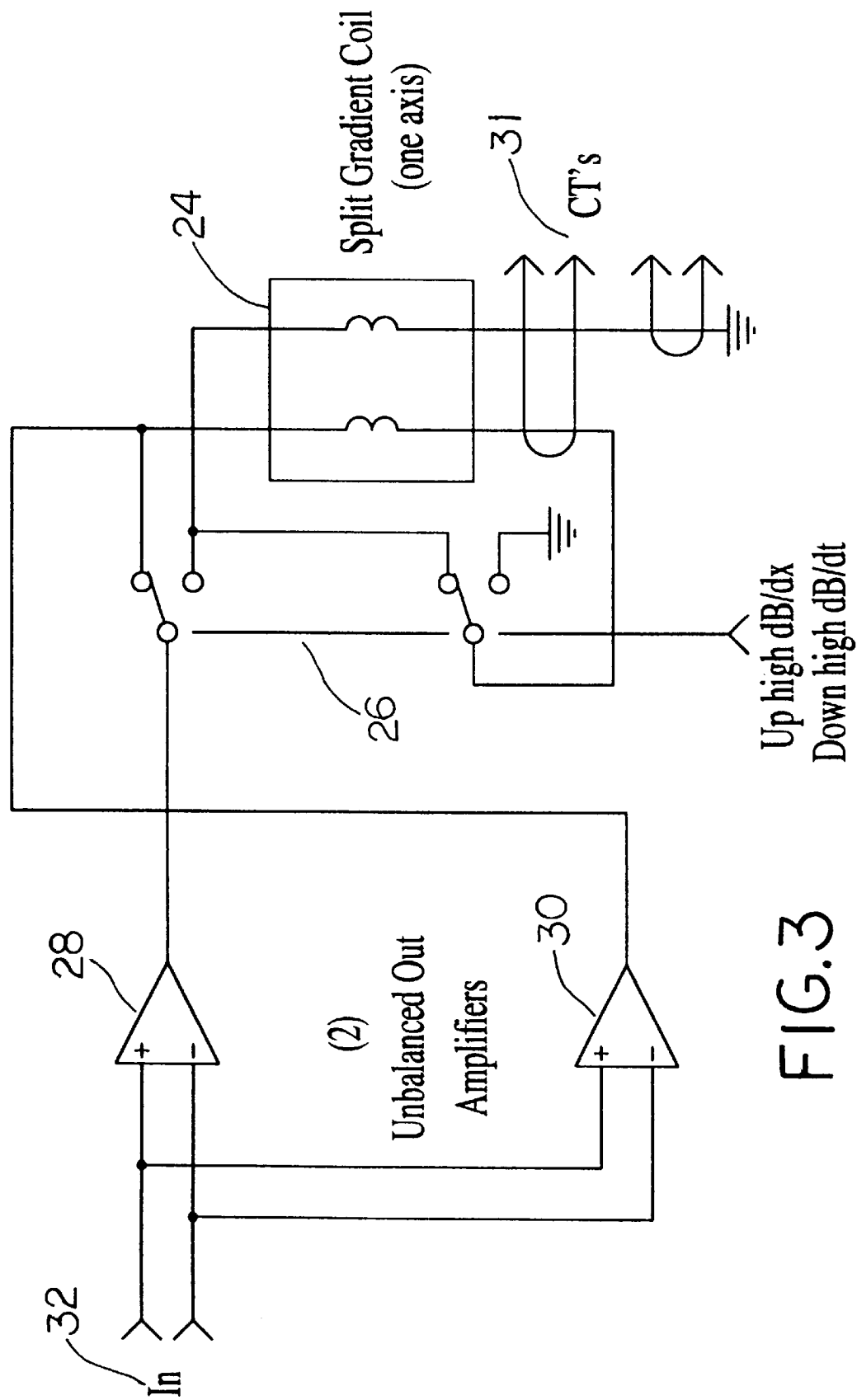
FIG. 3 is a view in diagram form of one embodiment of the invention showing unbalanced output amplifiers.

In FIG. 3, a common-to-ground half-bridge configuration is shown. A split gradient coil 24 is connected through a two pole, single throw switch 26 to gradient amplifiers 28 and 30. Amplifiers 28 and 30 are driven by a single signal source 32. Amplifiers 28 and 30 do not have their outputs mutually interconnected and are connected to common ground. Switch 26 serves when shifted down to direct the output of each of the amplifiers 28 and 30 through a separate individual coil component of the gradient coil 24 when in a high dB/dt operative configuration to produce high speed imaging at standard field strengths. When switch 26 is shifted into the up position as shown in FIG. 3, the individual coil components of gradient coil 24 connected as a single seriesed coil causing a high dB/dx operational mode producing a doubling of the field strength at a medium speed. In the up position the outputs of amplifiers 28 and 30 are joined in parallel to double the available current.

Figure 4:
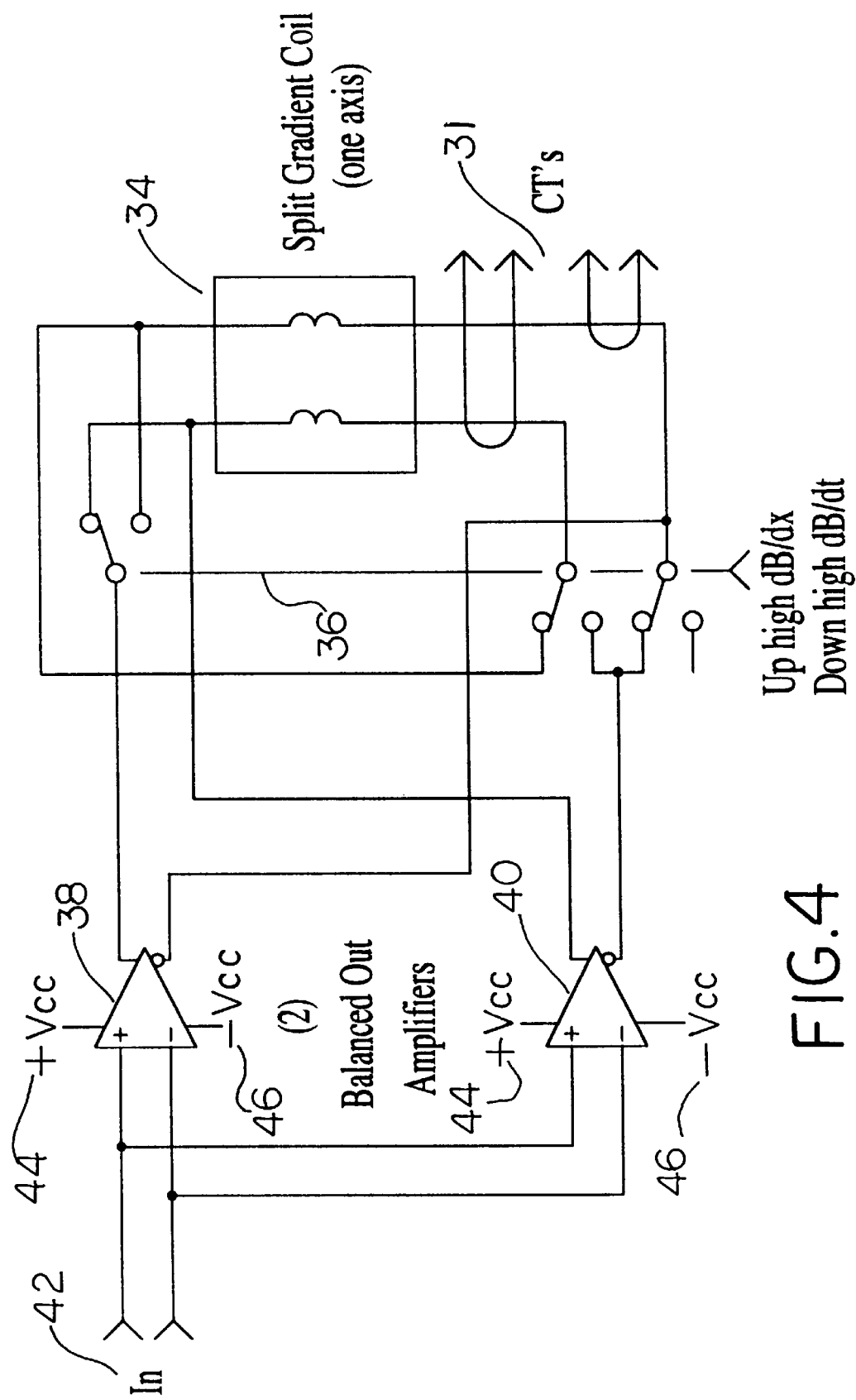
FIG. 4 is a view in diagram form of a second embodiment of the invention showing balanced output amplifiers.

In FIG. 4, a split gradient coil 34 is connected by a single throw double pole switch 36 to gradient amplifiers 38 and 40. Amplifiers 38, 40 are connected to a single signal source 42. Amplifiers 38 and 40 are of a full bridged balanced output configuration. When switch 36 is in its up or high dB/dx configuration as illustrated in FIG. 4, the coils are placed in series. When in this mode or operation position, the coil would ideally be designed, for example, at 350 A RMS since amplifiers are now capable of 400 A, twice the current. The slew rate for this mode would be one half of the maximum slew rate. When switch 36 is shifted into its down or high dB/dt mode, each of the coil components of the gradient coil 34 is driven by a separate amplifier 38, 40.

Also when in this mode of configuration of FIG. 4, amplifiers of 800 volts, 200 amps can be accommodated by additional modules with the result being that a 2 G/cm SR 120 scanner can be upgraded to a 4 G/cm SR 120 scanner at a time when it can be afforded. This upgrade would suggest the elimination of switch 36 since the amplifiers being utilized could easily overheat the coils in the high dB/dx mode. In both configurations of FIGS. 3 and 4, current measuring instrumentation 31 is used for control.

Figure 5:
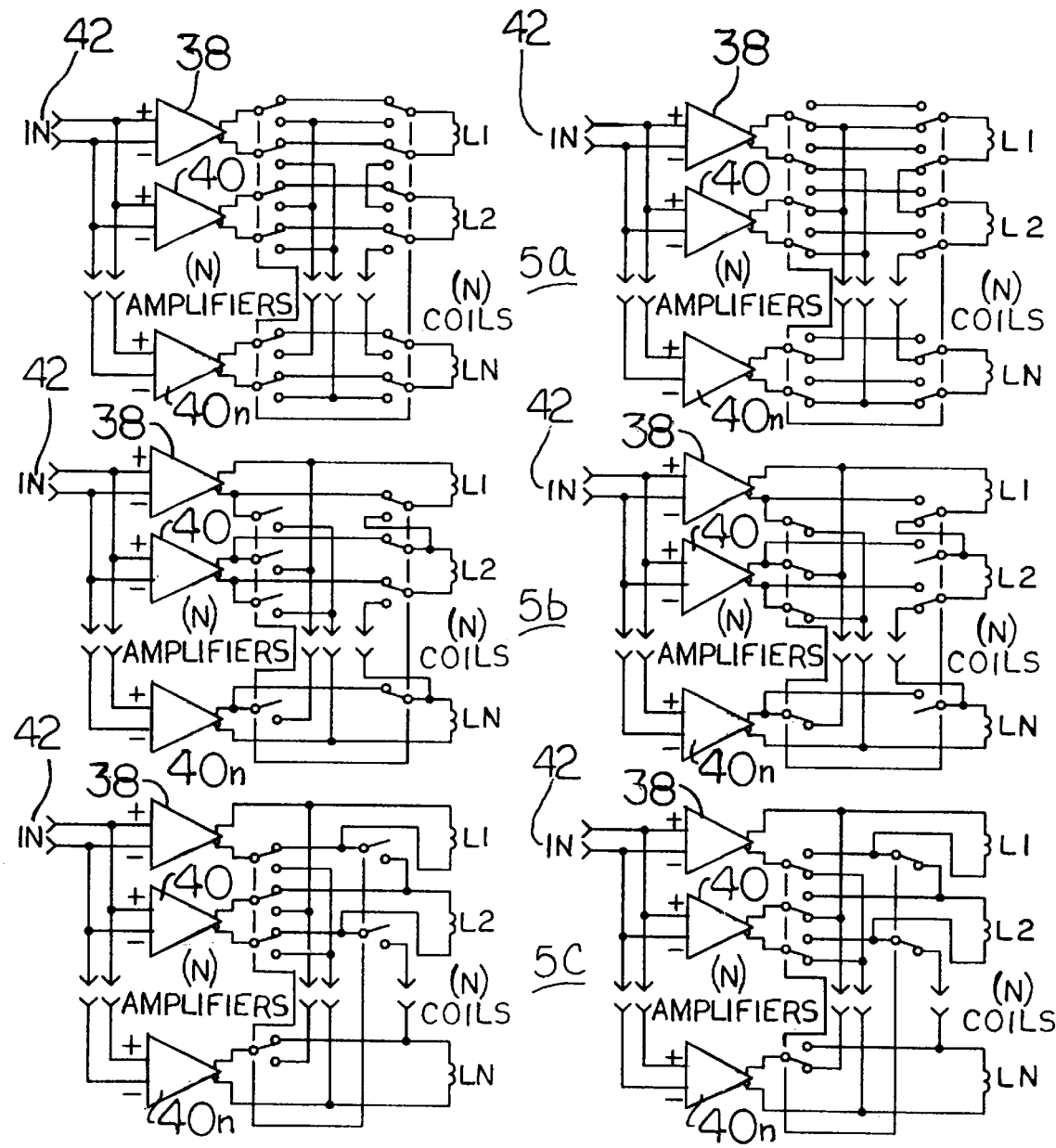
FIG. 5 is a series of diagram drawings showing in each of Subfigures 5a, 5b and 5c the alternative two modes of operation of the invention shown in FIG. 4 with a differing form of connection.

In FIG. 5, various configurations of the balanced amplifier mode of FIG. 4 are shown (shown in FIGS. 5a, 5b, and 5c) to accommodate multiple coil components (L) of split gradient coils, the numbering in FIGS. 5a, 5b, and 5c of the coil components (i.e., L1, L2, and LN) indicates that a plurality of coil components may be used by simply repeating the shown circuit. The number of gradient amplifiers (38, 40, and 40N) indicates a corresponding plurality of amplifiers. The number of coil components or pairs of such coils would depend upon the intended mode of operation of the configuration such as in magnetic resonance imaging scanners or other types of magnetic devices. In each of the configurations of FIG. 5, a single signal source 42 is utilized to drive the gradient amplifiers 38, 40, 40N.

Figure 1:
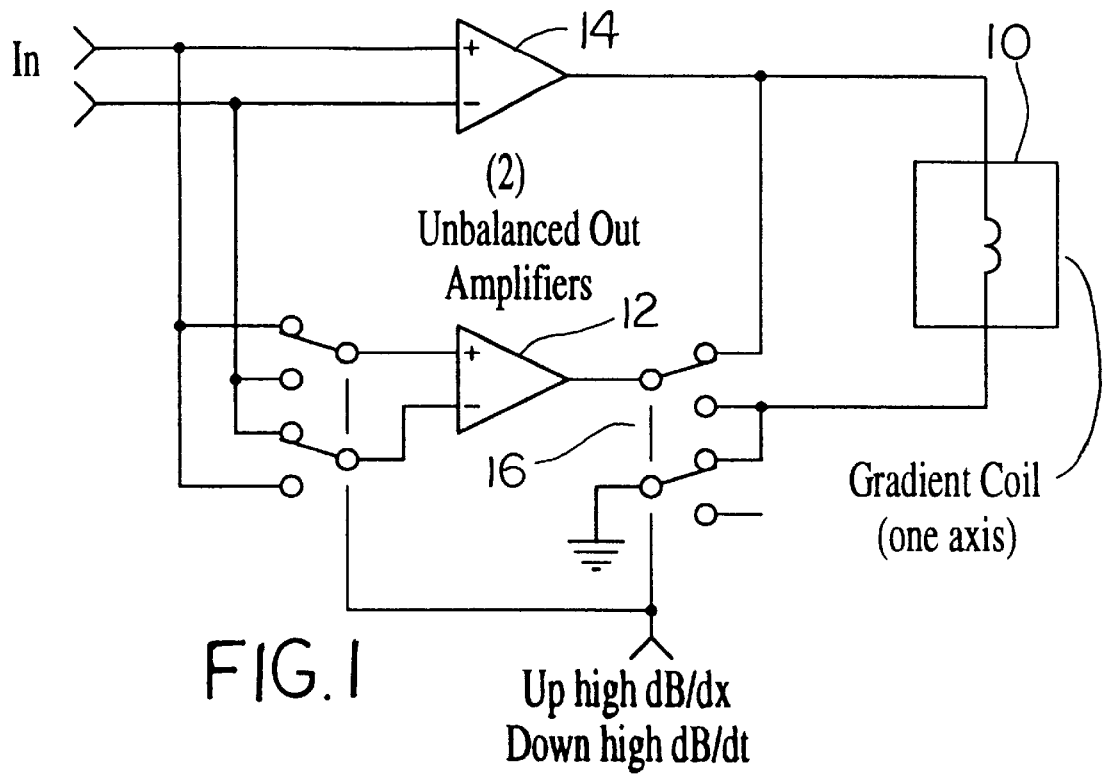
FIG. 1 is an illustration of a dual configuration single gradient coil system as used in the prior art.
Figure 2:
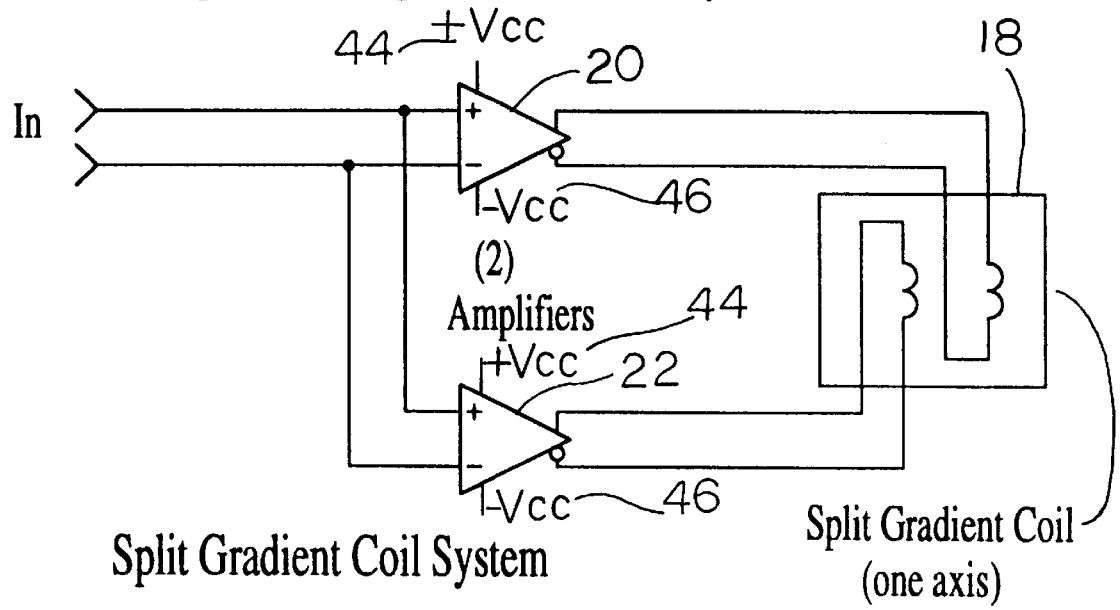
FIG. 2 is a view of a split gradient coil system as used in the prior art.

What is presented here is a system capable of high speed imaging at FDA dB/dt limits and a 4 Gauss/cm performance without a further doubling of cost. This system could be considerably larger than the standard system of scanners being utilized at the present time. The power supply system is also simplified as it is singular and shared 44, 46 (as seen in FIGS. 2 and 4 as example) by all amplifiers for all axes. Sharing a power supply between all axes reduces its total size to two thirds of that required by requiring all axes to be individually powered. This is because gradient systems use no more than two axes in full power at any given time in a scanner.

The invention is not to be limited to the details above given but may be modified in accordance with the following claims.

What I claim is:

1. A gradient coil system comprising at least two gradient coil components, a plurality of amplifiers connected to said coil components, said amplifiers adapted for connection to a signal source, and switch means having a first position wherein said coil components are connected in series and said amplifiers are connected in parallel and a second position wherein each of said coil components is connected to a single one of said amplifiers.

2. The gradient coil system of claim 1 wherein said coil components form a split coil having a single axis.

3. The gradient coil system of claim 1 and a single power source shared in common with each of said amplifiers.

4. A gradient coil system including two coils, two amplifiers, and a switch connected to the coils and the amplifiers, the switch being movable between a first position wherein the amplifiers are connected in parallel to drive both coils which are connected in series, and a second position wherein one amplifier drives one coil and the other amplifier drives the other coil.

5. The system of claim 4 wherein the coils constitute a split gradient coil of a single axis of the system.

6. The system of claim 4 wherein the switch is a two-pole, single through switch.

7. The system of claim 4 wherein the amplifiers are driven by a common signal source.

8. The system of claim 4 wherein the amplifiers are in a common-to-ground, half bridge configuration.

9. The system of claim 8 wherein the switch includes a first switching part having an input connected to the one amplifier output, a first output connected to the other amplifier output and to one side of one coil, and a second output connected to one side of the other coil, and a second switching part having an input connected to the other side of the one coil, a first output connected to the first switching part second output, and a second output connected to ground.

10. The system of claim 4 wherein the amplifiers are in a full bridge, balanced output configuration.

11. The system of claim 10 wherein the switch includes a first switching part having an input connected to a positive output of the one amplifier, a first output connected to a positive output of the other amplifier and to one side of one coil, and a second output connected to one side of the other coil, a second switching part having an input connected to the other side of the one coil, a first output connected to the first switching part second output, and a second output connected to a negative output of the other amplifier, and a third switching part having an input connected to the other side of the other coil and a negative output of the one amplifier, a first output connected to the second switching part second output, and a second output which is opened.

12. A gradient coil system including a plurality of coils, a corresponding plurality of amplifiers, and a plurality of switches connected between the coils and amplifiers, the switches being movable into a first configuration wherein each amplifier drives a separate coil and a second configuration wherein the plurality of amplifiers are connected in parallel and drive the plurality of coils which are connected in series.

13. The system of claim 12 wherein each of the amplifiers has a common input source and includes a positive output and a negative output.

14. The system of claim 13 wherein the positive output and the negative output of each amplifier are each connected to an input of two separate switches, each side of the coil corresponding to the amplifier being connected to an input of two other separate switches.

15. A gradient coil system for one axis of a magnetic resonance imaging scanner including amplifier means having at least two amplifiers for amplifying a common input signal, coil means having at least two split gradient coils for generating a magnetic field, and switching means connecting the amplifier means to the coil means for configuring the system in either a first mode wherein the amplifiers are connected in parallel and drive the coils which are connected in series to provide an increased field strength or a second mode wherein each amplifier drives a separate coil to provide high speed imaging.

16. The system of claim 15 wherein the amplifiers are balanced output amplifiers.

17. The system of claim 15 wherein the switching means includes a two-pole, single throw switch.

* * * * *